United States Patent [19]

Kawasaki et al.

[11] Patent Number: 5,781,010
[45] Date of Patent: Jul. 14, 1998

[54] METHOD AND APPARATUS FOR MR IMAGING WITHOUT A FLASHING PHENOMENON OF AN OBJECT HAVING PERIODICAL MOTION

[75] Inventors: Shinji Kawasaki, Matsudo; Hiroshi Nishimura, Kashiwa, both of Japan

[73] Assignee: Hitachi Medical Corporation, Tokyo, Japan

[21] Appl. No.: 690,448

[22] Filed: Jul. 29, 1996

[30] Foreign Application Priority Data

Jul. 31, 1995 [JP] Japan .................................. 7-195374

[51] Int. Cl.$^6$ .................................................. A61B 5/055
[52] U.S. Cl. ........................ 324/309; 324/306; 600/413
[58] Field of Search ........................ 324/300, 306, 324/307, 309, 318; 128/653.2, 653.3; 600/413, 428

[56] References Cited

U.S. PATENT DOCUMENTS

| | | | |
|---|---|---|---|
| 5,225,780 | 7/1993 | Riederer et al. | 324/309 |
| 5,251,628 | 10/1993 | Foo | 128/653.2 |
| 5,429,134 | 7/1995 | Foo | 600/413 |
| 5,435,303 | 7/1995 | Bernstein et al. | 600/413 |
| 5,545,992 | 8/1996 | Foo | 324/309 |

OTHER PUBLICATIONS

Radiology, vol. 150, pp. 121–127, 1984.
Radiology, vol. 178, pp. 357–360, 1991.

*Primary Examiner*—Sandra L. O'Shea
*Assistant Examiner*—Michael Eisenberg
*Attorney, Agent, or Firm*—Antonelli, Terry, Stout & Kraus, LLP

[57] ABSTRACT

In an MR imaging method, at least radio frequency pulses for excitation are repetitiously consecutively applied in accordance with predetermined pulse sequences until measurement of NMR signals corresponding to phase encoding numbers necessary for desired image construction ends, an external trigger signal synchronous with periodical motion of an object to be inspected is received during the period of application, and a gradient magnetic field having a phase encoding amount necessary for the image construction is applied at the termination of a predetermined time following the reception of the trigger signal to fetch at least one NMR signal. When a plurality of NMR signals are desired to be fetched, a plurality of gradient magnetic fields having mutually different phase encoding amounts are applied. This process is repeated until measurement of NMR signals corresponding to phase encoding numbers necessary for desired image construction ends and an image at a desired phase of the periodical motion of the inspected object is constructed using the thus fetched NMR signals.

10 Claims, 4 Drawing Sheets

METHOD AND APPARATUS FOR MR IMAGING WITHOUT A FLASHING PHENOMENON OF AN OBJECT HAVING PERIODICAL MOTION

BACKGROUND OF THE INVENTION

The present invention relates to magnetic resonance imaging (hereinafter simply referred to as MRI) apparatus and method for producing a tomographic image of a desired region of an object to be inspected by utilizing a nuclear magnetic resonance (hereinafter simply referred to as NMR) phenomenon and more particularly, to method and apparatus suitable for cinematography adapted to display an object varying at a constant period as a series of continuous time-sharing images.

The MRI apparatus is adapted to measure density distribution, relaxation time distribution and the like of atomic nuclear spins (hereinafter simply referred to as spins) in a desired examined region of an object to be inspected by utilizing the NMR phenomenon and to display an image of a desired slice of the inspected object on the basis of measured data.

To this end, in the MRI apparatus, a radio frequency magnetic field is applied to an object placed in a static magnetic field by means of a radio frequency coil to excite spins and an electromagnetic wave (NMR signal) discharged when the spins return to the original low energy state is detected by means of another radio frequency coil. In order for the NMR signal to be assigned with positional information, linear gradient magnetic fields superimposed on the static magnetic field are used. By superimposing the gradient magnetic fields on the uniform static magnetic field, a spatial magnetic field gradient can be established. The gradient magnetic fields are applied in a slice direction and phase encoding and frequency encoding directions by means of gradient magnetic field coils arranged in mutually orthogonal three-axis directions, and the application of these gradient magnetic fields, the application of the radio frequency magnetic field and the measurement of NMR signals are repeated in a predetermined pulse sequence by means of a sequencer of the MRI apparatus.

Incidentally, for an imaging region of an object to be inspected which moves at a constant period owing to beat, respiration and body motion, an imaging method called a cinematography is employed which displays images at individual phases of the motion as a series of continuous time-sharing images. In this case, a method is widely used in which imaging is performed in synchronism with a periodical variation of the inspected object. In this type of method, the most fundamental one is an electrocardiography (ECG) synchronous imaging method for imaging the heart described in, for example. "Radiology; Vol. 150; pp. 121–127, '84".

With this method, however, the pulse sequence must be repeated by the number of beats corresponding to a product of (the number of desired phase encoding x the number of signal addition operations) during imaging and disadvantageously, the imaging time is prolonged. As an improved method for decreasing the imaging time, "Radiology; Vol. 178, pp. 357–360, '91" has been proposed. In this method, an R wave of an ECG waveform is utilized as a trigger signal during heart imaging and pulse sequences for generation and measurement of NMR signals are started at the termination of a predetermined delay time following reception of the trigger signal. Then, a cycle of measurement of predetermined signals necessary for image reconstruction for a desired number of cardiac phases during one beat cycle is repeated by a number of beats by which the predetermined number of signals necessary for image reconstruction can be obtained. At that time, a method is adopted in which in association with one trigger signal, a plurality of pulse sequences are executed every cardiac phase to fetch signals corresponding to a plurality of phase encoding steps. Accordingly, the imaging time can be expected to be reduced in accordance with the number of phase encoding steps fetched per trigger signal.

Incidentally, it is known that the period of heartbeats varies by about 10 to 20% even in the case of healthy persons but in the case of a patient suffering arrhythmia, it varies frequently more intensively and when a plurality of cardiac phases of the heart are imaged using the ECG synchronous method through MRI as described previously, measurement of signals of all cardiac phases is typically set in anticipation of the aforementioned variation such that the measurement ends within a time which is generally 80 to 90% of a one averaged beat period.

Accordingly, in any of the prior arts above mentioned, the R wave of the ECG waveform is utilized as the trigger signal during heart imaging, the pulse sequences are started after receipt of the trigger signal and are repeated only during fetching of a predetermined number of signals and after completion of fetching of the predetermined number of signals, the pulse sequences are stopped to await next trigger signal.

With the prior arts as above, a problem called a flashing phenomenon arises for the reasons to be described below. Flashing is a phenomenon that only the signal level of the first cardiac phase image which succeeds the trigger signal becomes higher than those of the ensuing images and in the case of moving image display, only the first cardiac phase image is seen as a high signal.

Generally, in order for a spin-lattice magnetization component affecting the signal intensity to recover the initial state after excitation, it takes, strictly speaking, infinite time and even time T1 for about 67% recovery amounts up to several of 100 msec in the case of the object nuclide being protons. But the repetition time TR set in actual imaging based on the prior art methods is specifically determined to be about several of 10 msec to hundred and several of 10 msec for the first prior art and about 10 and several msec for the second prior art and consequently, NMR signals following one trigger signal are gradually decreased as the signal measurement proceeds in accordance with the execution of repetition of the pulse sequences. When the measurement of signals of desired cardiac phases ends after one trigger signal in this manner, the repetition of the pulse sequences is stopped and a waiting time occurs before next trigger signal is received. Since measurement is so set as to typically complete the measurement of signals of desired all cardiac phases within 80 to 90% of the average beat period as described previously, the waiting time for the next trigger signal becomes longer than the repetition time TR and as a result, the first signal measured after the waiting time, that is, the signal at the first cardiac phase after the next trigger signal becomes larger in signal intensity than signals at the other cardiac phases. This tendency similarly takes place for an NMR signal which is firstly generated after each of the trigger signals and consequently, the flash phenomenon that the first cardiac phase image generated immediately after the trigger signal becomes a higher signal than those of other cardiac phase images arises when images of the individual cardiac phases which are ultimately reconstructed by collecting all of the signals are compared with each other.

SUMMARY OF THE INVENTION

An object of the present invention is to provide MRI method and apparatus which can eliminate the flashing caused by the above-described reason to avoid hindrance affecting diagnosis.

To accomplish the above object, according to the present invention, in an MRI method in which a trigger signal synchronous with periodical motion of an object to be inspected is received, pulse sequences are started for irradiating radio frequency pulses (hereinafter referred to as exciting pulses) which excite nuclear spins in a tissue of the inspected object and for measuring NMR signals generated by nuclei and a tomographic image of the tissue at a desired phase of the periodical motion is obtained, consecutive irradiation of exciting pulses and generation of NMR signals are repeated at a constant repetition time irrespective of the presence or absence of the trigger signal during an interval in which all signals necessary for forming images are obtained, necessary signals are fetched at the termination of desired delay times following receipt of the trigger signal, and images of the tissue at phases corresponding to the delay times are prepared using the fetched signals. The delay time ranging from the reception of the trigger signal and the measurement of the necessary signals is suitably set in accordance with a desired cardiac phase.

The number of signals of images at a desired cardiac phase to be obtained during one beat cycle may be singular or plural. When one signal is obtained for an image of one cardiac phase during one beat cycle, the next phase encoding amount is assigned during the next beat cycle. When a plurality of signals are obtained for images of one cardiac phase during one beat cycle, the plurality of signals are fetched after being assigned with mutually different suitable phase encoding amounts or steps within a predetermined time width inclusive of a time point corresponding to the desired cardiac phase. An image at the cardiac phase is prepared using the plurality of thus phase-encoded signals.

Preferably, according to the MRI method of the present invention, during a predetermined period preceding start of fetching of signals, exciting pulses are applied repetitiously at the same repetition time as that for excitation during the interval in which signals are obtained.

In the present invention, by irradiating exciting pulses at the constant repetition time TR irrespective of the presence or absence of the trigger signal until measurement of all signals necessary for image reconstruction ends, spins can keep a steady state (SSFP: steady state free precession) during the measurement of all of the signals and signals of constant intensity can always be generated. Accordingly, the flashing phenomenon occurring in the prior arts in which only an image at one cardiac phase becomes a high signal can be prevented. This ensures that upon diagnosis using a cine image, all images can have uniform signal intensity and hindrance affecting diagnosis due to the flashing phenomenon can be prevented.

As described above, according to the MRI method of the present invention, when images at individual phases of periodical motion are obtained in synchronism with the motion, incessant irradiation of pulses for exciting spins and generation of signals are repeated at a constant repetition time during measurement of signals necessary for image formation and as a result, spins can keep the SSFP state and signals of constant intensity can always be generated to prevent the occurrence of the flashing phenomenon which arises in the prior arts owing to the difference in spin-lattice relaxation time among individual phases. Accordingly, when performing diagnosis by using a series of time-sharing sequential images, all images can have uniform signal intensity and a cine image facilitating diagnosis can be obtained.

Further, according to the present invention, since exciting pulses are incessantly irradiated at the same repetition time TR as that conditioned for signal measurement during an interval which is about three to four times the spin-lattice relaxation time T1, spins can assume the SSFP state before the signal measurement starts and the intensity of a signal immediately after start of the measurement can be prevented from exceeding that of the ensuing signals.

DESCRIPTION OF THE PREFERRED EMBODIMENTS

The present invention will now be described by way of example with reference to the accompanying drawings.

Figure 1:
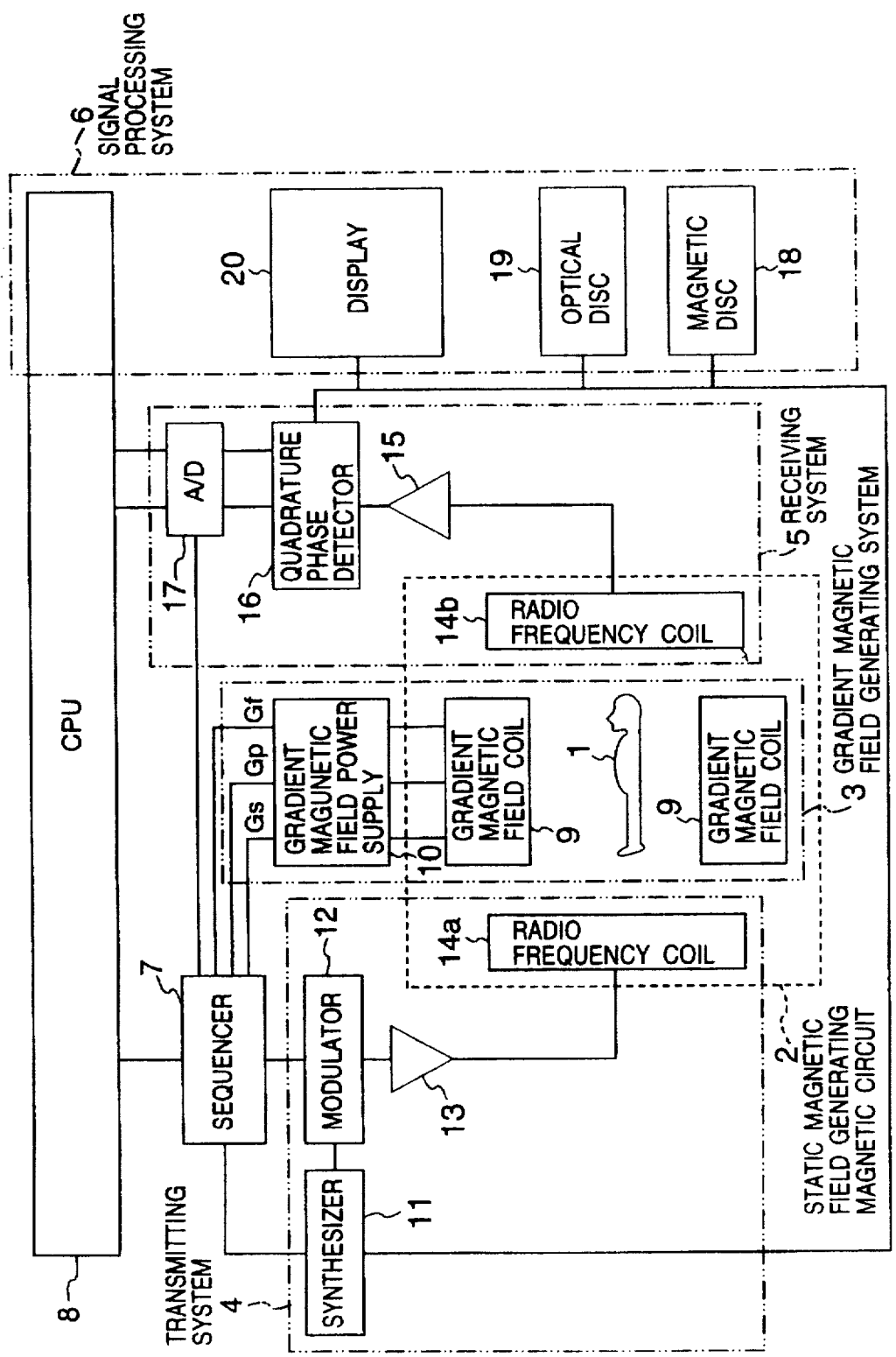
FIG. 1 is a block diagram schematically showing the construction of an MRI apparatus to which the present invention is applied.

FIG. 1 shows the overall construction of an MRI apparatus to which the present invention is applied. The MRI apparatus comprises a static magnetic field generating magnetic circuit 2 for applying a static magnetic field to a space in which an object to be inspected 1 is placed, a gradient magnetic field generating system 3 for applying gradient magnetic fields to the space, a sequencer 7 for repetitiously applying radio frequency pulses for causing nuclei of atoms constituting a biophysical tissue of the inspected object 1 to undergo nuclear magnetic resonance in accordance with the predetermined pulse sequences, a transmitting system 4 for irradiating a radio frequency magnetic field which cooperates with the radio frequency pulses from the sequencer 7 to cause nuclei of atoms constituting the biophysical tissue of the inspected object 1 to undergo nuclear magnetic resonance, a receiving system 5 for detecting echo signals discharged by the nuclear magnetic resonance phenomenon, a signal processing system 6 for performing an image reconstructing operation by using the echo signals detected by the receiving system 5, a central processing unit (hereinafter referred to as a CPU) 8 for controlling the transmitting system, receiving system and signal processing system, and three-axis gradient magnetic field coils 9 which form gradient magnetic fields in three-axis directions to obtain information about positions in the space. The gradient magnetic field coils 9 are supplied with currents from a gradient magnetic field power supply 10 operated by signals from the sequencer 7 to generate the gradient magnetic fields.

In the apparatus, the object to be inspected 1 is placed in the static magnetic field generating magnetic circuit 2 for generating a static magnetic field of about 0.02 to 2 teslas and is irradiated with a radio frequency magnetic field (electromagnetic wave) having a frequency f equal to a Larmor frequency ν of nuclei to be measured, in accordance with the predetermined pulse sequences by means of a radio frequency coil 14a inside the transmitting system 4. The radio frequency magnetic field can be obtained by transmitting to the radio frequency coil 14a a signal which is sent from the sequencer 7 controlled by the CPU and which is amplified by an amplifier 13 for the radio frequency magnetic field coil. At that time, a slice direction gradient magnetic field for determining a slice plane of the inspected object and phase encoding direction and frequency encoding direction gradient magnetic fields for assigning NMR signals with positional information are applied. As to the exciting pulses, the application timings thereof are instructed by the sequencer 7. As to the exciting pulses, radio frequency pulses which are generated by a synthesizer 11 are modulated in amplitude by a modulator 12 and fed to the amplifier 13.

NMR signals (electromagnetic waves) generated by the radio frequency magnetic field are received by a radio frequency coil 14b inside the receiving system 5, amplified and shaped by an amplifier 15, detected by a quadrature phase detector 16, digitized by an A/D converter 17 and fed to the CPU 8. Reconstructing operation of an image is effected on the basis of the data in the CPU 8 and a tomographic image of the inspected object 1 is displayed on a display 20 (hereinafter referred to as a CRT). A magnetic disc 18 and an optical disc 19 are adapted to store the thus obtained image.

Figure 3:
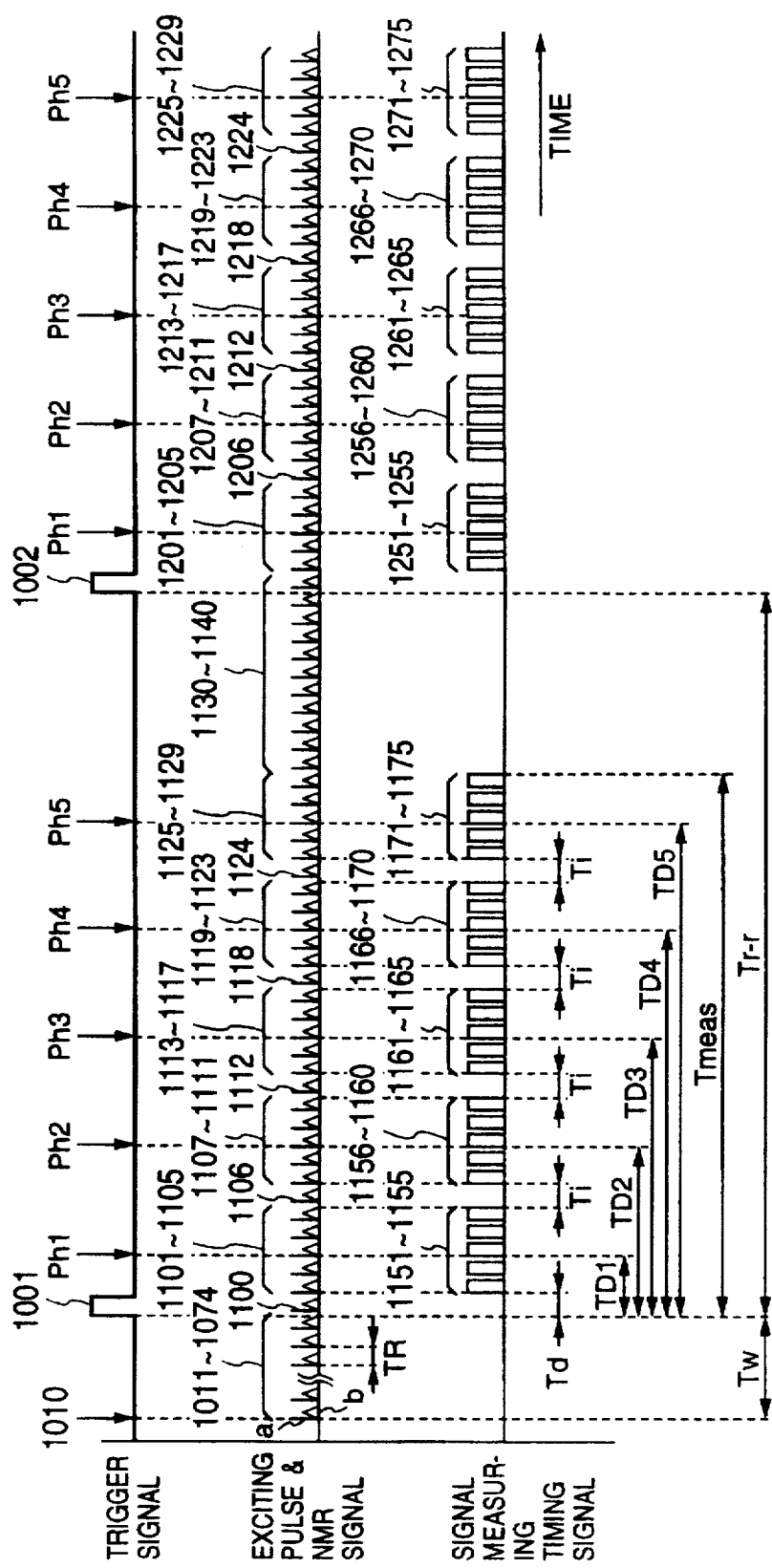
FIG. 3 is a timing chart showing an embodiment of pulse sequences according to the present invention.

Next, an embodiment of an MRI method of the present invention using the MRI apparatus as above will be described. In the MRI method according to the present embodiment, electrocardiographic (ECG) measurement is carried out concurrently with effectuation of MR imaging to generate a trigger signal for the pulse sequences in synchronism with an R wave of an ECG waveform. FIG. 3 exemplifies, in time-sharing fashion, a trigger signal, pulse sequences for generation of NMR signals, and timings of signal fetching. In the Figure, only two cycles of heartbeats are shown for avoidance of prolixity but actually, several cycles are measured. The present embodiment is described as imaging five cardiac phases Ph1, Ph2, Ph3, Ph4 and Ph5 which correspond to cardiac phases at the termination of times TD1, TD2, TD3, TD4 and TD5, respectively. In FIG. 3, Tr-r is a beat trigger interval and Tmeas is an imaging time.

Figure 2:
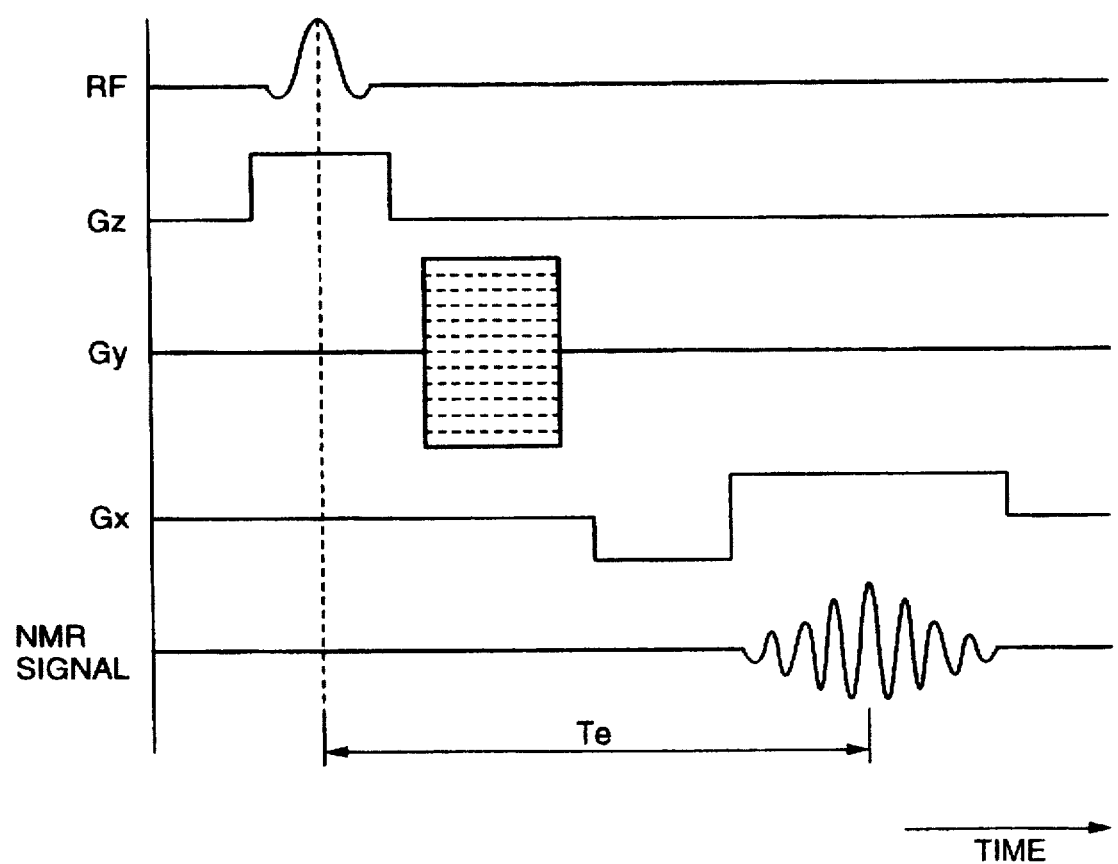
FIG. 2 is a timing chart showing an example of a pulse sequence used in an MR imaging method of the present invention.

Each of the pulse sequences 1011 to 1229 shown contains at least one event of irradiation of an exciting pulse and generation of a signal thereby and is constructed of a sequence based on the gradient echo (GE) method as shown in FIG. 2. More particularly, after an exciting pulse RF of a small flip angle is irradiated simultaneously with the application of a slice gradient magnetic field Gz, a readout gradient magnetic field pulse Gx whose polarity reverses is applied to generate an echo signal. As in the case of the spin echo method, Gy designates a phase encoding gradient magnetic field or assigning phase encoding to signals. In FIG. 3, reference numeral a designates an exciting pulse and b an NMR signal.

As soon as measurement initiation is instructed by an operator at timing 1010, the sequences based on the GE method are started and then, the application of the pulse sequences continues to repeat itself until measurement of all signals necessary for succeeding formation of images. Fetching of signals, however, is not carried out in all of the sequences and only signals necessary for image formation at the five cardiac phases Ph1, Ph2, Ph3, Ph4 and Ph5 are measured as will be described later.

Repetition time (interval between adjacent exciting pulses) TR of the pulse sequences is shorter than spin-lattice relaxation time T1 of spins and it specifically amounts up to about 10 msec. For better understanding of illustration, the repetition time TR is approximately 25 msec in FIG. 3. In the present embodiment, signals of 125 phase encoding steps per image are used for image formation.

Immediately after the start of the pulse sequences, during a period Tw corresponding to about three to four times the spin-lattice relaxation time T1 of object nuclear spins, more specifically, approximately several of 100 msec to several of 1000 msec in the case of protons, measurement of signals is not carried out but only generation of NMR signals is effected by applying exciting pulses irrespective of the presence or absence of a trigger signal. This is effective to cause nuclear spins to reach the SSFP state before initiation of signal fetching in order that a change in signal intensity due to the spin-lattice relaxation following the initiation of fetching can be controlled. In FIG. 3, during an interval corresponding to 64 sequences 1011 to 1074, exciting pulse irradiation and NMR signal generation thereby are permitted but the thus generated NMR signals are not measured.

After the lapse of the preset Tw, a state ready for signal fetching is established upon receipt of a trigger signal 1001.

After the reception of the trigger signal 1001, signal measurement is not carried out before time Td has elapsed, indicating that a signal 1100 generated by an initial exciting pulse during this period is not measured. After the lapse of time Td, sequential five signals 1101 to 1105 are measured in synchronism with timing signals 1151 to 1155. In the sequences for measurement of five signals, measurement is carried out by sequentially changing the intensity of the phase encoding gradient magnetic field Gy shown in, for example, the pulse sequence of FIG. 2 to increment the phase encoding step by a predetermined number, for example, 25 in terms of assigned phase encoding number, thus producing five signals assigned with phase encoding steps. These signals are stored as signal data of an image at cardiac phase Ph1. At that time, the aforementioned signal non-measurement period Td is so set that a central one 1103 of the five signals substantially coincides with the cardiac phase Ph1, that is, measurement of the signal 1103 substantially corresponds to a delay time TD1 from the trigger signal 1001. As a result, the five signals 1101 to 1105 have information concerning the heart in the neighborhood of the timing of TD1 and hence an image prepared from the five signals reflects shape information at the cardiac phase Ph1. Through the above procedure, measurement of signals for the first cardiac phase Ph1 associated with the trigger signal 1001 ends.

Next, for measurement of signals for the second cardiac phase Ph2, five signals to be measured are assigned with phase encoding amounts as in the case of the first cardiac phase Ph1 and signal measurement is so controlled that a central one of the five signals substantially coincides with a desired Ph2. More particularly, an interval of time Ti following the measurement of the fifth signal 1105 for the first cardiac phase is set as a signal non-measurement period and a signal 1106 generated during this period is not measured. Then, at timings 1156 to 1160, signals 1107 to 1111 are measured. As a result, a signal 1109 positioned centrally of these five signals substantially coincides with the cardiac phase Ph2, that is, the timing of fetching the signal 1109 substantially corresponds to a delay time of TD2 from the trigger signal 1001. Then, as in the case of the first cardiac phase, an image constructed of the five signals 1107 to 1111 reflects shape information at the cardiac phase Ph2.

Subsequently, signals for the third, fourth and fifth cardiac phases are measured similarly.

In this manner, the signal measurement associated with the first trigger signal 1001 ends at a signal measurement timing 1175 but measurement of all signals of 125 phase encoding steps necessary for constructing an image is not completed and therefore, the pulse sequence repeats the cycle of exciting pulse irradiation and NMR signal generation at the constant period TR (after exciting signal 1130).

Thus, after reception of a second trigger signal 1002, signals for cardiac phases Ph1 to Ph5 are sequentially measured following the lapse of a predetermined signal non-measurement period Td as in the case of the measurement after the reception of the first trigger signal. However, signals to be measured in the second cycle in association with the reception of the second trigger signal are assigned with phase encoding amounts different from those assigned to signals to be measured in the first cycle. Subsequently, a similar operation is repeated until the 25th trigger signal and 125=(5×25) signals can be obtained for the individual cardiac phases. Throughout the operation, the consecutive exciting pulse irradiation and signal generation are repeated at the constant repetition time as described previously and when collection of all of the 125 signals ends, the exciting pulse irradiation and signal measurement ends to stop the pulse sequences.

Figure 4:
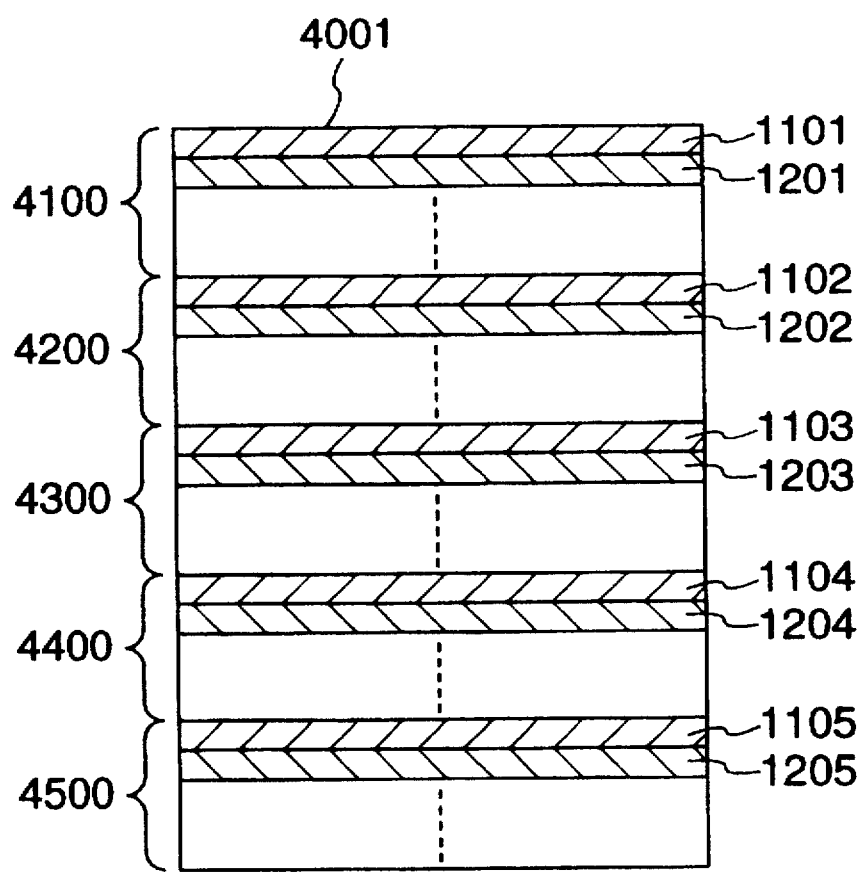
FIG. 4 is a diagram showing an example of arrangement of measured signals on K space in the MR imaging method of the present invention.

The individual signals are sampled at predetermined sampling times and sampling numbers to provide data pieces for image reconstruction which are arranged on a K space (measured data space). Arrangement of measured signals on the K space is shown in FIG. 4. FIG. 4 shows a K space 4001 for constructing an image of one cardiac phase but actually, the number of K spaces corresponds to the number of cardiac phases to be imaged, that is, five in correspondence to Ph1 to Ph5 in the present embodiment.

In the present embodiment, the K space 4001 is divided into five segments 4100 to 4500 in correspondence to fetching of five signals for one cardiac phase during one cycle. Firstly, five signals 1101 to 1105 measured in association with the first trigger signal 1001, that is, data pieces obtained by sampling the signals at the predetermined times and sampling numbers are arranged at the upper most row in each of the segments 4100 to 4500. In this example, the phase encoding numbers of the individual signals are 1, 26, 51, 76 and 101. Next, five signals 1201 to 1205 measured in association with the second trigger signal 1002 are arranged at rows next to those for the signals 1101 to 1105. This operation is 25 times repeated until five signals measured in association with the 25th trigger signal, so that 125 signals can be arranged on K space. The phase encoding numbers of signals measured in the final cycle are 25, 50, 75, 100 and 125. By subjecting the thus obtained signals to two-dimensional Fourier transform, an image corresponding to the first cardiac phase can be obtained.

Signals obtained for the second to fifth cardiac phases are similarly arranged on K space and by subjecting these signals to two-dimensional Fourier transform, an image corresponding to each cardiac phase can be obtained. Then, by sequentially displaying images of the first to fifth cardiac phases on the CRT, a cine image indicating motion of the heart in time-sharing fashion can be obtained. At that time, signals measured for the first to fifth cardiac phases are all measured under the SSFP state to have substantially uniform intensity and therefore, the flashing phenomenon that high brightness occurs at only the first cardiac phase can be prevented and a cine image facilitating diagnosis can be obtained.

The method for arrangement of signals on the K space as shown in FIG. 3 is not limitative and for example, a spiral scan method in which K space is spirally scanned can also be adopted. The type of the arrangement can be determined in accordance how to assign the phase encoding amounts to the individual sequences.

While in the foregoing embodiments five signals are measured for each of the five cardiac phases, the present invention is not limited thereto and the number of cardiac phases can be selected to a desired value as long as the number of sequences falls within one cycle so that, for example, only an end-diastolic phase image and an end-systolic phase image which are synchronous with the peak of an R wave or a consecutive plurality of cardiac phases may also be imaged. The number of signals to be measured for one cardiac phase may be singular or plural and is not limited to five as far as it falls within a time width which is deemed to be nearly equivalent to one cardiac phase. But when one signal is measured for one cardiac phase during one cycle, the pulse sequence must be repeated by the times of the phase encoding numbers and therefore, from the viewpoint of requirement of time reduction, a plurality of signals may preferably be measured.

In the foregoing embodiments, the R wave of ECG measurement is used as the trigger signal which is ECG synchronous but motion at a constant period such as respiration and body motion can be converted into an electrical signal which in turn is used as a trigger.

Further, in the present embodiment, the gradient echo method is used as the sequence for generation of consecutive, repetitive signals but this is not limitative and a division type EPI (echo planar imaging method), for example, may also be employed. The present invention is particularly effective to a sequence in which the repetition time is shorter than the spin-lattice relaxation time T1.

Satisfactorily, the period Tw in FIG. 3 may be the time for nuclear spins inside the inspected object to reach the SSFP state.

In FIG. 3, at a time point which does not correspond to a signal measurement timing signal, the gradient magnetic field is not always required to be applied and it suffices that only at least the RF pulse $a$ for excitation is applied.

The present invention is in no way limited to the foregoing embodiments and various modifications and alterations within the framework of appended claims may fall within the present invention.

We claim:

1. A magnetic resonance (MR) imaging method for producing a tomographic image of an object to be inspected placed in a static magnetic field by applying RF pulses for excitation and gradient magnetic fields to said inspected object and measuring NMR signals generated in said inspected object, comprising the steps of:

applying at least radio frequency pulses for excitation repetitiously and consecutively in accordance with predetermined pulse sequences until measurement of NMR signals corresponding to phase encoding numbers necessary for desired image construction ends;

receiving an external trigger signal synchronous with periodical motion of said inspected object;

fetching at least one NMR signal by applying a gradient magnetic field having a phase encoding amount necessary for said image construction at the termination of a predetermined time following a time point for reception of said trigger signal;

repeating said step of receiving an external trigger signal and said step of fetching at least one NMR signal until measurement of NMR signals corresponding to phase encoding numbers necessary for said desired image construction; and constructing an image at a desired phase of the periodical motion of said inspected object by using said fetched NMR signal.

2. An MR imaging method according to claim 1, wherein said step of fetching at least one NMR signal includes:

applying a plurality of gradient magnetic fields having different phase encoding amounts in synchronism with repetitiously applied radio frequency pulses within a predetermined time width containing the termination of said predetermined time; and fetching a plurality of NMR signals obtained under the application of said plurality of gradient magnetic fields.

3. An MR imaging method according to claim 1, wherein said step of applying at least radio frequency pulses repetitiously consecutively in accordance with predetermined pulse sequences includes applying at least said radio frequency pulses for excitation plural times, starting at a time point preceding the initiation of fetching of NMR signals.

4. An MR imaging method according to claim 3, wherein said step of applying at least said radio frequency pulses for excitation plural times includes repetitiously applying at least said radio frequency pulses for excitation until nuclear spins inside said inspected object reach an SSFP state.

5. An MRI apparatus comprising:

static magnetic field generating means for applying a static magnetic field to an object to be inspected;

gradient magnetic field generating means for applying gradient magnetic fields to said inspected object;

means for generating RF pulses which cause nuclei of atoms constituting a biophysical tissue of said inspected object to undergo nuclear magnetic resonance;

means for detecting at least an NMR signal;

means for performing image reconstruction by using a plurality of detected NMR signals;

means for displaying a produced image;

control means for repetitiously consecutively applying at least said radio frequency pulses for excitation in accordance with predetermined pulse sequences until measurement of NMR signals corresponding to phase encoding numbers necessary for desired image construction ends;

means for receiving an external trigger signal synchronous with periodical motion of said inspected object;

means for applying a first gradient magnetic field having a phase encoding step necessary for said image construction at least once or plural times at the termination of a predetermined time following the reception of said external trigger signal, said first gradient magnetic field having mutually different phase encoding amounts when being applied plural times;

means for detecting at least one NMR signal obtained in a pulse sequence in which said first gradient magnetic field is applied; and means for repeating the processes of applying said first gradient magnetic field in association with the reception of said external trigger signal and detecting at least one NMR signal until measurement of NMR signals corresponding to phase encoding numbers necessary for desired image construction ends.

6. An MRI apparatus according to claim 5, wherein said means for applying a first gradient magnetic field at least once includes:

means for generating a plurality of said first gradient magnetic fields having mutually different phase encoding amounts in synchronism with said radio frequency pulses applied repetitiously within a time width containing the termination of said predetermined time; and means for detecting a plurality of NMR signals produced under the application of said plurality of first gradient magnetic fields.

7. An MRI apparatus according to claim 5, wherein said control means includes means for applying at least said radio frequency pulses for excitation plural times, starting at a time point preceding the detection of NMR signals.

8. An MRI apparatus according to claim 7, wherein said control means includes means for repetitiously applying at least said radio frequency pulses for excitation until nuclear spins inside said inspected object reach an SSFP state.

9. An MR imaging method according to claim 1, wherein the MR imaging method effects imaging without a flashing phenomenon, and the step of fetching at least one NMR signal includes applying predetermined encoding gradient magnetic fields having a different encoding amount from one another.

10. An MRI apparatus according to claim 5, wherein the MRI apparatus effects imaging without a flashing phenomenon, and the means for applying a first gradient magnetic field having a phase encoding step includes applying different phase encoding amounts.

* * * * *